US012772671B2

(12) United States Patent
Xiao

(10) Patent No.: US 12,772,671 B2
(45) Date of Patent: Oct. 20, 2026

(54) DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Xiang Xiao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1422 days.

(21) Appl. No.: 17/599,822

(22) PCT Filed: Sep. 1, 2021

(86) PCT No.: PCT/CN2021/116072
§ 371 (c)(1),
(2) Date: Mar. 2, 2023

(87) PCT Pub. No.: WO2023/024136
PCT Pub. Date: Mar. 2, 2023

(65) Prior Publication Data

US 2024/0049520 A1 Feb. 8, 2024

(30) Foreign Application Priority Data

Aug. 27, 2021 (CN) ........................ 202110996827.2

(51) Int. Cl.
*H10K 59/124* (2023.01)

(52) U.S. Cl.
CPC ................................ *H10K 59/124* (2023.02)

(58) Field of Classification Search
CPC .......... H10K 59/124; H10K 2102/351; H10K 59/1213; H10K 59/123; H10K 59/122;
(Continued)

(56) References Cited

U.S. PATENT DOCUMENTS

2017/0117345 A1* 4/2017 Seo ..................... H10K 59/131
2017/0194402 A1* 7/2017 Choi ............... H10K 59/80515
(Continued)

FOREIGN PATENT DOCUMENTS

CN 1790733 A 6/2006
CN 107068719 A 8/2017
(Continued)

OTHER PUBLICATIONS

International Search Report in International application No. PCT/CN2021/116072, mailed on May 26, 2022.
(Continued)

*Primary Examiner* — Chad M Dicke
*Assistant Examiner* — Gary Abel
(74) *Attorney, Agent, or Firm* — PV IP PC; Christopher Ruprecht; Wei Te Chung

(57) ABSTRACT

Embodiments of the present application discloses a display panel. A thin-film transistor layer includes a first stacking structure and a second stacking structure. The first stacking structure and the second stacking structure are provided corresponding to a same opening. The first stacking structure includes conductive layers and insulating layers. The second stacking structure includes a compensation layer and insulating layers. A number of the conductive layers of the first stacking structure is greater than a number of the conductive layers of the second stacking structure. The compensation layer is used to increase a height of the second stacking structure. The planarization layer covers the thin-film transistor layer.

17 Claims, 5 Drawing Sheets

(58) Field of Classification Search
CPC .. H10K 59/131; H10D 86/441; H10D 86/451; H10H 29/41; H10H 29/49; G02F 1/136286
See application file for complete search history.

(56) References Cited

U.S. PATENT DOCUMENTS

| | | | | |
|---|---|---|---|---|
| 2017/0301707 | A1* | 10/2017 | Jiang | H10K 59/131 |
| 2019/0221616 | A1 | 7/2019 | Chung et al. | |
| 2022/0255047 | A1* | 8/2022 | Fang | H10K 50/86 |
| 2023/0217711 | A1* | 7/2023 | Lin | H10K 59/1213<br>257/71 |

FOREIGN PATENT DOCUMENTS

| | | | |
|---|---|---|---|
| CN | 208521937 | U | 2/2019 |
| CN | 110767714 | A | 2/2020 |
| CN | 111146215 | A | 5/2020 |
| CN | 111987136 | A | 11/2020 |
| CN | 112018159 | A | 12/2020 |
| CN | 112909196 | A | 6/2021 |
| CN | 113097223 | A | 7/2021 |
| EP | 3806151 | A1 | 4/2021 |

OTHER PUBLICATIONS

Written Opinion of the International Search Authority in International application No. PCT/CN2021/116072,mailed on May 26, 2022.

Chinese Office Action issued in corresponding Chinese Patent Application No. 202110996827.2 dated Oct. 14, 2022, pp. 1-7.

* cited by examiner

DISPLAY PANEL

RELATED APPLICATIONS

This application is a Notional Phase of PCT Patent Application No. PCT/CN2021/116072 having international filing date Sep. 1, 2021, which claims the benefit of priority of Chinese Patent Application No. 202110996827.2 filed on Aug. 27, 2021. The contents of the above applications are all incorporated by reference as if fully set forth herein in their entirety.

FIELD OF INVENTION

This application relates to the fields of display technologies, and in particular to a display panel.

BACKGROUND OF INVENTION

Organic light emitting diodes (OLED) have the characteristics of self-luminescence, fast response times, wide viewing angles, etc., and has broad application prospects. Regarding the evaporation of active organic light emitting diodes (AMOLED), the film thickness uniformity is satisfactory when the evaporation material reaches the pixel area, the requirements for substrate flatness of pixel area are relatively loose, and ink of AMOLED in an inkjet printing (IJP) process printing to the pixel area is flowing. One of the main influencing factors of ink spreadability is the substrate flatness in the pixel area. It is required that the maximum step difference of the entire pixel area is as small as possible. If the ink spreadability is uneven, and goes beyond the specification, the film thickness will be uneven after drying, which will eventually affect the luminescence effect, so the flatness of the planarization layer of IJP-AMOLED has a more demanding requirement.

In the research and practice of the conventional art, the inventor of the present application found that a planarization layer is an organic photosensitive material, the current solution is to thicken the planarization layer, and, thus a larger step difference requires a thicker the planarization layer. Therefore, the existing problems and possible risks are that: (1) the capacity of one-time flattening of the planarization layer is limited. Namely, when the substrate step difference reaches a certain degree, the planarization layer has been increased to a great thickness, but the flatness still cannot meet the requirements; (2) the planarization layer has a design of openings, and a too deep opening has an impact on the subsequent film deposition, such as uplift and breakage of lines.

In summary, in the inkjet printing process of the conventional art, the planarization layer has difficulty in meeting the flatness required for preparation, the maximum step difference of the entire pixel area is large, so that the ink spreading is uneven, and the film thickness of the light-emitting layer after drying is uneven, which affects the display performance of the OLED display panel.

SUMMARY OF INVENTION

Technical Problem

Embodiments of the present application provide a display panel, that can reduce the risk of uneven film thickness of the light-emitting layer.

Technical Solutions

The present application provides a display panel including a plurality of pixel regions, wherein the display panel includes:

a substrate;

a thin-film transistor layer provided on the substrate, and including a first stacking structure and a second stacking structure, the first stacking structure and the second stacking structure corresponding to a same pixel region, wherein the first stacking structure includes a plurality of conductive layers arranged in different layers, and a plurality of insulating layers, the second stacking structure includes a compensation layer and the insulating layers, wherein a number of the conductive layers of the first stacking structure is greater than a number of conductive layers of the second stacking structure; and a height of the first stacking structure is greater than or equal to a height of the second stacking structure, and the compensation layer is used to increase the height of the second stacking structure;

a planarization layer covering the thin-film transistor layer, a surface of the planarization layer away from the substrate being a planar surface;

an electrode layer provided on the planarization layer;

a pixel definition layer provided on the electrode layer, and including a plurality of openings, one of the openings is corresponding to one of the pixel regions, and the first stacking structure and the second stacking structure provided corresponding to a same opening; and a light-emitting layer provided in the opening.

Optionally, in some embodiments of the present application, a surface of the first stacking structure away from the substrate is flush with a surface of the second stacking structure away from the substrate; and Optionally, in some embodiments of the present application, a portion of a surface of the planarization layer away from the substrate corresponding to the pixel regions is a planar surface.

Optionally, in some embodiments of the present application, the thin-film transistor layer further includes a plurality of insulating layers stacked on the substrate, and the conductive layer is arranged between adjacent two of the insulating layers;

the compensation layer is provided at any position on the substrate in a stacking direction of the second stacking structure.

Optionally, in some embodiments of the present application, the compensation layer has multiple layers, and the multiple layers of the compensation layer are arranged in different layers from each other in the stacking direction of the second stacking structure.

Optionally, in some embodiments of the present application, the second stacking structure further includes at least one of the conductive layers.

Optionally, in some embodiments of the present application, the second stacking structure includes a first compensation structure and a second compensation structure, wherein the first compensation structure includes a first compensation layer and the insulating layers; the second compensation structure includes a second compensation layer and the insulating layers, a number of the conductive layers of the second compensation structure is less than a number of the conductive layers of the first compensation structure;

the first compensation layer is provided at any position on the substrate in a stacking direction of the first compensation structure; and the second compensation layer is provided at any position on the substrate in a stacking direction of the second compensation structure.

Optionally, in some embodiments of the present application, the first compensation layer is connected to the second compensation layer.

Optionally, in some embodiments of the present application, a thickness of the first compensation layer is less than a thickness of the second compensation layer.

Optionally, in some embodiments of the present application, the thin-film transistor layer further includes a third stacking structure provided corresponding to the opening, wherein the third stacking structure is located at a side of the second stacking structure in an area of the same opening, and the third stacking structure includes the second compensation layer and at least one of the conductive layers, and the number of conductive layers of the second stacking structure is greater than a number of the conductive layers of the third stacking structure; and the third compensation layer is provided at any position on the substrate in a stacking direction of the third stacking structure.

Optionally, in some embodiments of the present application, a surface of the first stacking structure away from the substrate, a surface of the second stacking structure away from the substrate, and a surface of the third stacking structure away from the substrate are flush.

Optionally, in some embodiments of the present application, the conductive layers include a first conductive layer, a second conductive layer, and a third conductive layer, and the insulating layers include a first insulating layer, a second insulating layer, and a third insulating layer;

the first stacking structure forms a capacitor structure sequentially stacked by a portion of the first conductive layer, the first insulating layer, a portion of the second conductive layer, the second insulating layer, a portion of the third conductive layer, and the third insulating layer; and the second stacking structure is sequentially stacked by the compensation layer, the first insulating layer, a portion of the second conductive layer, the second insulating layer, and the third insulating layer.

Optionally, in some embodiments of the present application, a thickness of the compensation layer is less than a sum of a thickness of the first conductive layer and a thickness of the third conductive layer.

Optionally, in some embodiments of the present application, the conductive layers include a first conductive layer, a second conductive layer, a third conductive layer, and a fourth conductive layer, and the insulating layers include a first insulating layer, a second insulating layer, a third insulating layer, and a fourth insulating layer; and the first stacking structure forms a thin-film transistor structure sequentially stacked by a portion of the first conductive layer, the first insulating layer, a portion of the fourth conductive layer, the fourth insulating layer, a portion of the second conductive layer, and the second insulating layer, a portion of the third conductive layer, and the third insulating layer; and the second stacking structure forms a capacitor structure sequentially stacked by the portion of the first conductive layer, the first insulating layer, and the compensation layer, the portion of the second conductive layer, the second insulating layer, the portion of the third conductive layer, and the third insulating layer.

Optionally, in some embodiments of the present application, the conductive layers include a first conductive layer, a second conductive layer, a third conductive layer, and a fourth conductive layer, and the insulating layers include a first insulating layer, a second insulating layer, a third insulating layer, and a fourth insulating layer; and the first stacking structure forms a thin-film transistor structure sequentially stacked by a portion of the first conductive layer, the first insulating layer, a portion of the fourth conductive layer, the fourth insulating layer, a portion of the second conductive layer, and the second insulating layer, a portion of the third conductive layer, and the third insulating layer; and the second stacking structure forms a capacitor structure sequentially stacked by the portion of the first conductive layer, the first insulating layer, and the compensation layer, the portion of the second conductive layer, the second insulating layer, the portion of the third conductive layer, and the third insulating layer; the third stacking structure is formed by sequentially stacking of the third compensation layer, the first insulating layer, a portion of the second conductive layer, the second insulating layer, and the third insulating layer.

Optionally, in some embodiments of the present application, a thickness of the third compensation layer is greater than or equal to a sum of a thickness of the fourth insulating layer and a thickness of the fourth conductive layer.

Accordingly, embodiments of the present application provides a display panel including a plurality of pixel regions, wherein the display panel includes:

a substrate;

a thin-film transistor layer provided on the substrate, and including a first stacking structure and a second stacking structure, wherein the first stacking structure includes a plurality of conductive layers arranged in different layers, and a plurality of insulating layers, the second stacking structure includes a compensation layer and the insulating layers, wherein a number of the conductive layers of the first stacking structure is greater than a number of conductive layers of the second stacking structure; and a height of the first stacking structure is greater than or equal to a height of the second stacking structure, and the compensation layer is used to increase the height of the second stacking structure;

a planarization layer covering the thin-film transistor layer;

an electrode layer provided on the planarization layer;

a pixel definition layer provided on the electrode layer, and including a plurality of openings, one of the openings is corresponding to one of the pixel regions, and the first stacking structure and the second stacking structure provided corresponding to a same opening; and a light-emitting layer provided in the opening;

wherein a surface of the first stacking structure away from the substrate is flush with a surface of the second stacking structure away from the substrate; and a portion of a surface of the planarization layer away from the substrate corresponding to the pixel regions is a planar surface.

Optionally, in some embodiments of the present application, the compensation layer is provided at any position on the substrate in a stacking direction of the second stacking structure.

Optionally, in some embodiments of the present application, the compensation layer has multiple layers, and the multiple layers of the compensation layer are arranged in different layers from each other in the stacking direction of the second stacking structure.

Optionally, in some embodiments of the present application, the second stacking structure further includes at least one of the conductive layers.

Beneficial Effect

Embodiments of the present application of a display panel include a substrate, a thin-film transistor layer, a planarization layer, an electrode layer, a pixel definition layer and light-emitting layer arranged in sequence. A thin-film transistor layer includes a first stacking structure and a second stacking structure. Both of the first stacking structure and the second stacking structure are provided corresponding to a same pixel region. The first stacking structure includes conductive layers and insulating layers arranged in different layers. The second stacking structure includes a compensation layer and insulating layers. A number of the conductive layers of the first stacking structure is greater than a number of the conductive layers of the second stacking structure. The compensation layer is used to increase a height of the second stacking structure. The planarization layer covers the thin-film transistor layer. The display panel of this embodiment adds a compensation layer in the second stacking structure to reduce the height difference between the first stacking structure and the second stacking structure, so that the planarization layer can flatten the first stacking structure and the second stacking structure, at least provide a relatively flat reference plane for the formation of the light-emitting layer, and then reduce the risk of uneven film thickness of the light-emitting layer.

DRAWINGS

In order to more clearly explain the technical solutions according to the embodiments of the present application, the following will briefly introduce the drawings that need to be used in the description of the embodiments. It is apparent that the drawings in the following description are only some embodiments of the present application. For those of skilled in the art can obtain other drawings based on these drawings without any creative work.

DETAILED DESCRIPTION OF EMBODIMENTS

The technical solutions in the embodiments of the present application will be clearly and completely described below in conjunction with the drawings in the embodiments of the present application. It is apparent that the described embodiments are only a part of the embodiments of the present application, rather than all the embodiments. On the basis of the embodiments of the present application, all other embodiments obtained by those skilled in the art without any creative work belong to the protection scope of the present application. In addition, it should be understood that the specific embodiments described herein are only used to illustrate and explain the application and are not used to limit the application. In the present application, in the absence of a contrary explanation, the location terms used herein, such as "above" and "below", usually refer to top and bottom of the device in actual use or working condition, specifically the direction of the accompanying drawings; while "inside" and "outside" are for an outline of the device.

Embodiments of the present application provide a display panel, that is described in detail below. It should be noted that the order of description of the following embodiments is not a limitation on the preferred order of the embodiments.

Figure 1:
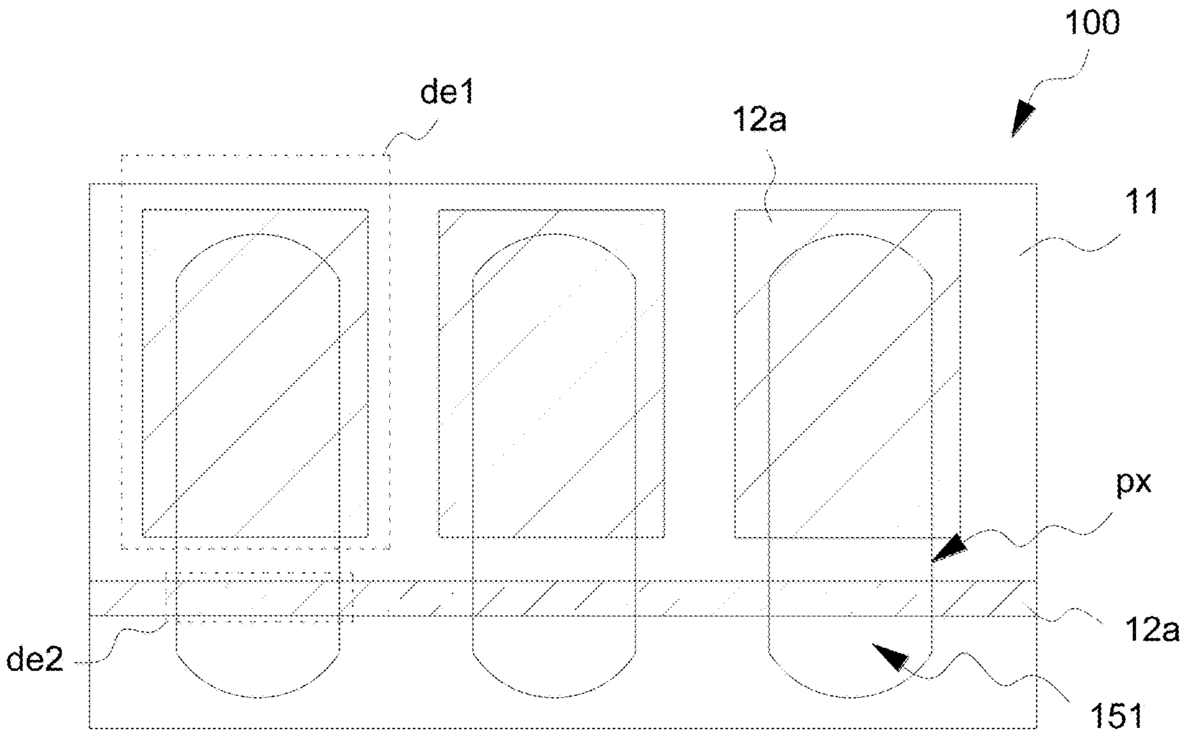
FIG. 1 is a schematic top structural view of a display panel provided by a first embodiment of the present application.
Figure 2:
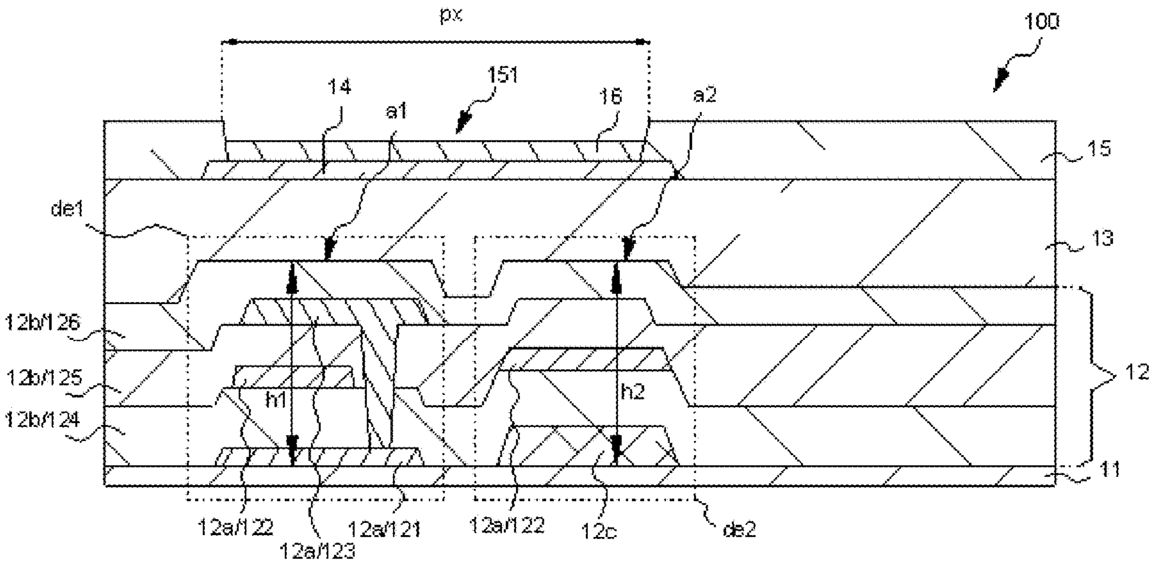
FIG. 2 is a first schematic cross-sectional structural view of the display panel provided by the first embodiment of the present application.
Figure 3:
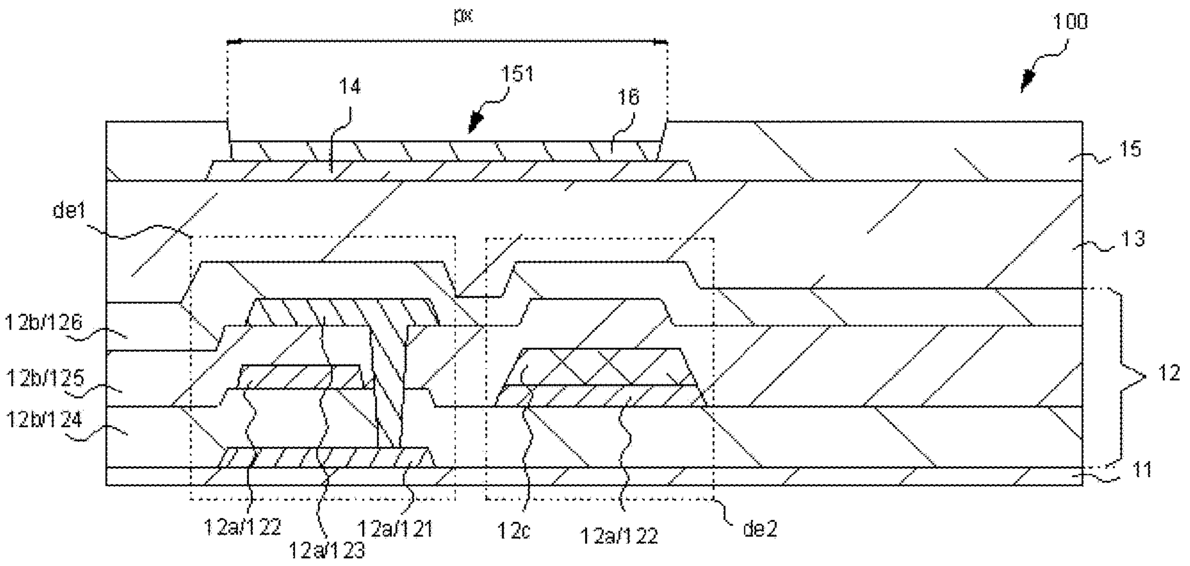
FIG. 3 is a second schematic cross-sectional structural view of the display panel provided by the first embodiment of the present application.

Referring to FIGS. 1 and 2, the embodiment of the present application provides a display panel 100, which includes a plurality of pixel regions px. The display panel 100 includes a substrate 11, a thin-film transistor layer 12, a planarization layer 13, an electrode layer 14, a pixel definition layer 15, and a light-emitting layer 16.

The thin-film transistor layer 12 is provided on the substrate 11. The thin-film transistor layer 12 includes a first stacking structure de1 and a second stacking structure de2, both of the first stacking structure de1 and the second stacking structure de2 are arranged corresponding to a same pixel region px. The first stacking structure de1 includes a conductive layer 12*a* and a plurality of insulating layer 12*b* provided in different layers. The second stacking structure de2 includes a compensation layer 12*c* and a plurality of insulating layer 12*b*. A number of the conductive layers 12*a* of the first stacking structure de1 is greater than a number of the conductive layers 12*a* of the second stacking structure de2. A height H1 of the first stacking structure de1 is greater than or equal to a height H2 of the second stacking structure de2. The compensation layer 12*c* is used to increase the height of the second stacking structure de2.

The planarization layer 13 covers the thin-film transistor layer 12. The electrode layer 14 is provided on the planarization layer 13. The pixel definition layer 15 is provided on the electrode layer 14. The pixel definition layer 15 includes a plurality of openings 151, and one of the openings 151 is correspondingly arranged in a pixel region px. The light-emitting layer 16 is provided within the openings 151. The first stacking structure de1 and the second stacking structure de2 are provided corresponding to a same opening 151.

The display panel 100 of the first embodiment adds the compensation layer 12*c* into the second stacking structure de2 to reduce a height difference between the first stacking structure and the second stacking structure existing in the conventional art, so that the planarization layer 13 can flatten the first stacking structure de1 and the second stacking structure de2, at least provide a relatively flat reference plane for the formation of the light-emitting layer 16, and then reduce the risk of uneven film thickness of the light-emitting layer 16.

Optionally, a portion of a surface of the planarization layer 13 away from the substrate 11 corresponding to the pixel regions px is a planar surface. Such arrangement provides a flat reference plane for the formation of the light-emitting layer 16 and further reduces the risk of uneven film thickness of the light-emitting layer 16.

Optionally, the substrate 11 may be a rigid substrate or a flexible substrate. Materials of the substrate 11 includes one of glass, sapphire, silicon, silicon dioxide, polyethylene, polypropylene, polystyrene, polylactic acid, polyethylene terephthalate, polyimide or polyurethane.

Optionally, materials of the compensation layer 12*c* may be metal materials or inorganic or organic materials, such as silicon oxide, silicon nitride, resin, copper or alloy.

Optionally, materials of the planarization layer 13 may be organic transparent film layers, such as transparent photoresist, epoxy resin, polyimide, polyvinyl alcohol, polymethylmethacrylate, polystyrene, etc.

Optionally, the display panel 100 further includes another electrode layer, which is provided on the light-emitting layer 16. Regarding two of the electrode layers, one is anode and the other is cathode.

Optionally, referring to FIG. 2, a surface a1 of the first stacking structure de1 away from the substrate 11 is flush with a surface a2 of the second stacking structure de2 away from the substrate 11. Such arrangement makes the first stacking structure de1 and the second stacking structure de2 equal in height, which facilitates to the planarization process of the planarization layer 13.

Optionally, in some embodiments, there may also be a certain height difference between the surface a1 of the first stacking structure de1 and the surface a2 of the second stacking structure de2, as long as the planarization layer 13 can flatten the first stacking structure de1 and the second stacking structure de2 and form a relatively flat reference plane.

Optionally, the thin-film transistor layer 12 further includes a plurality of insulating layers 12*b* stacked on the substrate 11, and the conductive layers 12*a* are provided between adjacent two of the insulating layers 12*b*.

In a stacking direction of the second stacking structure de2, the compensation layer 12*c* is provided at any position on the substrate.

Optionally, for example, the conductive layers 12*a* includes a first conductive layer 121, a second conductive layer 122, and a third conductive layer 123. The insulating layers 12*b* include a first insulating layer 124, a second insulating layer 125, and a third insulating layer 126.

Optionally, the second stacking structure de2 further includes at least one of the conductive layers 12*a*. The second stacking structure de2 is formed by stacking the conductive layer 12*a* and a plurality of insulating layers 12*c*.

Optionally, the compensation layer 12*c* extends to a boundary of the second stacking structure de2 to compensate a height of an area between the first stacking structure de1 and the second stacking structure de2.

Optionally, a thickness of the compensation layer 12*c* is greater than a thickness of the first conductive layer 121.

Optionally, as shown in FIG. 2, the first stacking structure de1 forms a capacitor structure sequentially stacked by a portion of the first conductive layer 121, the first insulating layer 124, a portion of the second conductive layer 122, the second insulating layer 125, a portion of the third conductive layer 123, and the third insulating layer 126.

The second stacking structure is formed by sequentially stacking of the compensation layer 12*c*, the first insulating layer 124, a portion of the second conductive layer 122, the second insulating layer 125, and the third insulating layer 126. Namely, the compensation layer 12*c* and the first conductive layer 121 are provide in same layer.

The first conductive layer 121 is a light shielding metal layer. Material of the compensation layer 12*c* is same as material of the first conductive layer 121, or it may be different. The second conductive layer 122 includes a first electrode 1221 and a trace 1222. The third conductive layer 123 includes a second electrode 1231. The first conductive layer 121 is connected to the second electrode 1231.

The first conductive layer 121, the first electrode 1221 and the second electrode 1231 are provided in the first stacking structure de1. The trace 1222 is provided in the second stacking structure de2.

Optionally, a thickness of the compensation layer 12*c* is equal to or slightly less than a sum of a thickness of the first conductive layer 121 and a thickness of the third conductive layer.

Optionally, in some embodiments, it is also possible to replace a portion of the second conductive layer 122 of the second stacked structure de2 with a portion of the third conductive layer 123, i.e., adjusting the layer position of the alignment 1222.

In some embodiments, the first stacking structure de1 may also be formed by stacking two conductive layers 12*a* and two insulating layers 12*b*, and the second stacking structure de2 is formed by stacking one conductive layer 12*a* and two insulating layers 12*b*, for example, when the thin-film transistor layer is a bottom gate thin-film transistor layer.

Optionally, referring to FIG. 2, in another structure of the first embodiment, the first stacking structure de1 forms a capacitor structure sequentially stacked by a portion of the first conductive layer 121, the first insulating layer 124, a portion of the second conductive layer 122, the second insulating layer 125, a portion of the third conductive layer 123, and the third insulating layer 126.

The second stacking structure de2 is formed by sequentially stacking of the first insulating layer 124, a portion of the second conductive layer 122, the compensation layer 12*c*, the second insulating layer 125, and the third insulating layer 126. Namely, the compensation layer 12*c* is provided between the second conductive layer 122 and the second insulating layer 125.

Certainly, the compensation layer 12*c* may also be arranged between the second insulating layer 125 and the third insulating layer 126, or on the third insulating layer 126.

Figure 4:
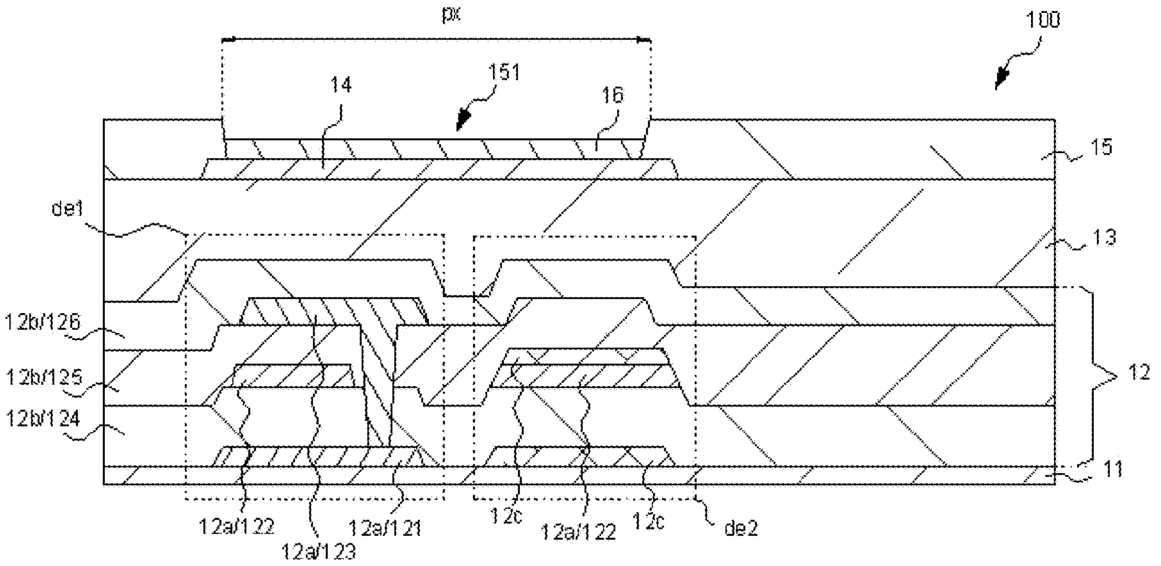
FIG. 4 is a third schematic cross-sectional structural view of the display panel provided by the first embodiment of the present application.

Optionally, referring to FIG. 4, in yet another structure of the first embodiment, the compensation layer may be multiple layers, and the multiple layers of the compensation layer are arranged in different layers from each other in the stacking direction of the second stacking structure.

For example, a compensation layer 12*c* and the first conductive layer 121 are provided at same layer, and a compensation layer 12*c* and the third conductive layer 123 are provided at same layer. The configuration of the compensation layers 12*c* has the effect of gradually increasing in height, which is convenient for film formation in the subsequent process.

In some embodiments, the second stacking structure de2 may also be formed by stacking the compensation layer 12*c* and a plurality of insulating layers 12$b$. Namely, the second stacking structure de2 does not have the conductive layer 12$a$.

Figure 5:
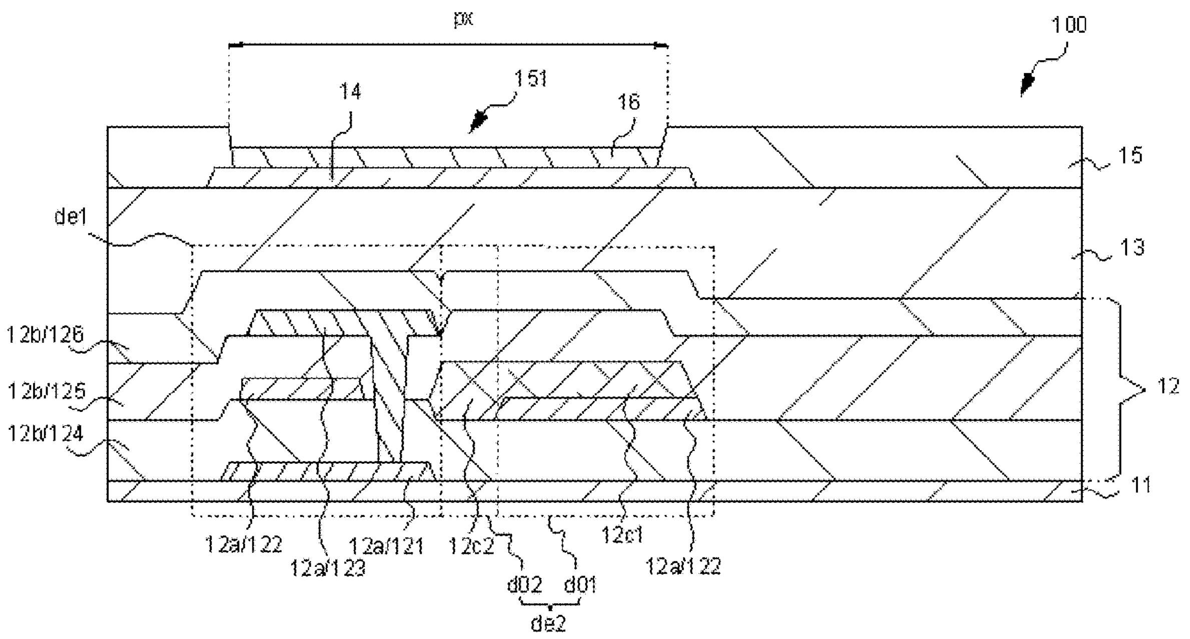
FIG. 5 is a fourth schematic cross-sectional structural view of the display panel provided by the first embodiment of the present application.

Referring to FIG. 5, in yet another structure of the first embodiment of the display panel 100, the second stacking structure de2 includes a first compensation structure d01 and a second compensation structure d02, and the first compensation structure d01 includes a first compensation layer 12$c$1 and a plurality of insulating layers 12$c$. The second compensation structure d02 includes a second compensation layer 12$c$2 and a plurality of insulating layers 12$c$. A number of the conductive layers 12$a$ of the second compensation structure d02 is less than a number of the conductive layer 12$a$ of the first compensation structure d01.

In a stacking direction of the first stacking structure d01, the first compensation layer 12$c$1 is provided at any position on the substrate.

In a stacking direction of the second compensation structure d02, the second compensation layer 12$c$2 is provided at any position on the substrate.

The first stacking structure d01 is formed by sequentially stacking of the first insulating layer 124, a portion of the second conductive layer 122, the compensation layer 12$c$1, the second insulating layer 125, and the third insulating layer 126. Namely, the first compensation layer 12$c$1 and the first conductive layer 121 are provided at same layer.

The second compensation structure d02 is formed by sequentially stacking of the second compensation layer 12$c$2, the first insulating layer 124, the second insulating layer 125, and the third insulating layer 126.

Optionally, the first compensation layer 12$c$1 and the second compensation layer 12$c$2 are connected and are an integrated structure, or they can be independent structures. By configuring the first compensation layer 12$c$1 and the second compensation layer 12$c$2 connected and being the integrated structure, it not only saves a mask process, but also reduces the risk of existing a steep slope between the first compensation structure d01 and the second compensation structure d02.

Optionally, a thickness of the first compensation layer 12$c$1 is less than a thickness of the second compensation layer 12$c$2 to reduce a height difference between the first compensation structure d01 and the second compensation structure d02.

In some embodiments, the thickness of the first compensation layer 12$c$1 and the thickness of the second compensation layer 12$c$2 may also be equal.

Optionally, a surface of the first compensation structure d01 away from the substrate 11 is flush with a surface of the second compensation structure d02 away from the substrate 11. Such arrangement facilitates the formation of a planarization layer 13 with a flat surface.

Figure 6:
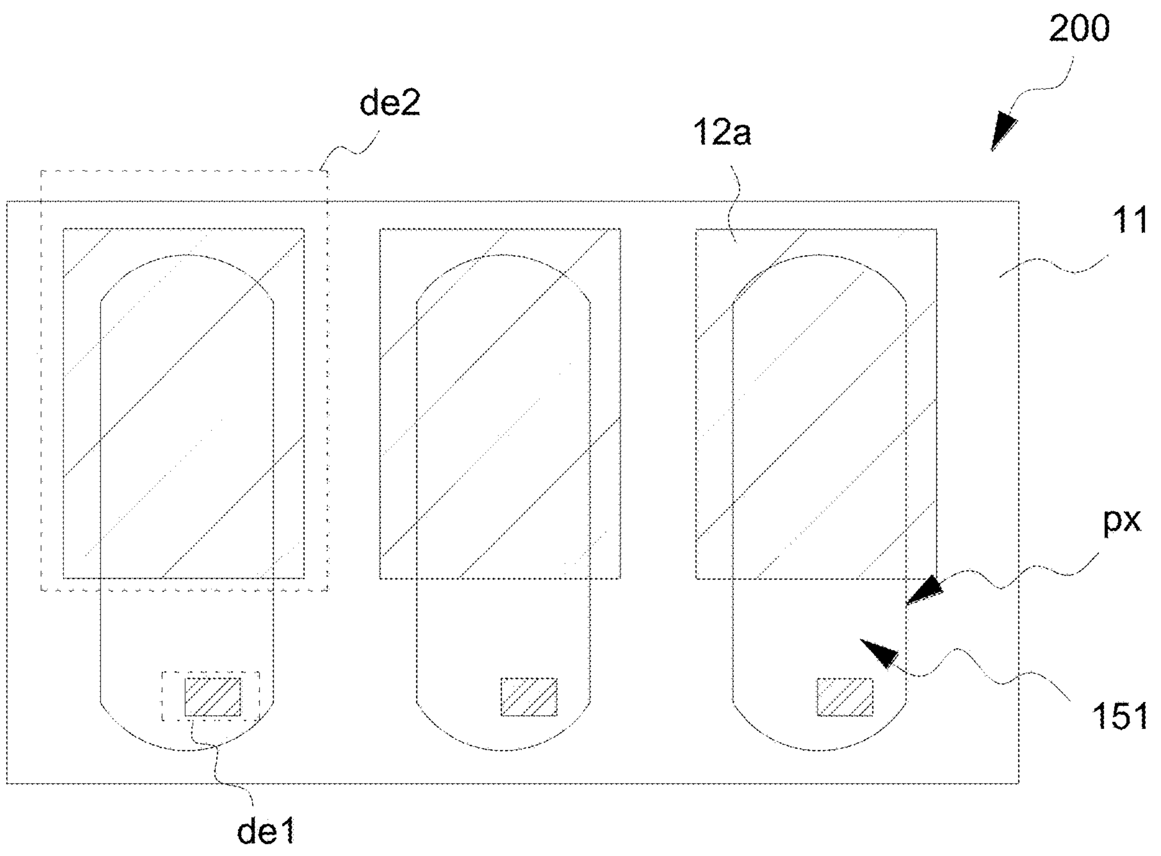
FIG. 6 is a schematic top structural view of a display panel provided by a second embodiment of the present application.
Figure 7:
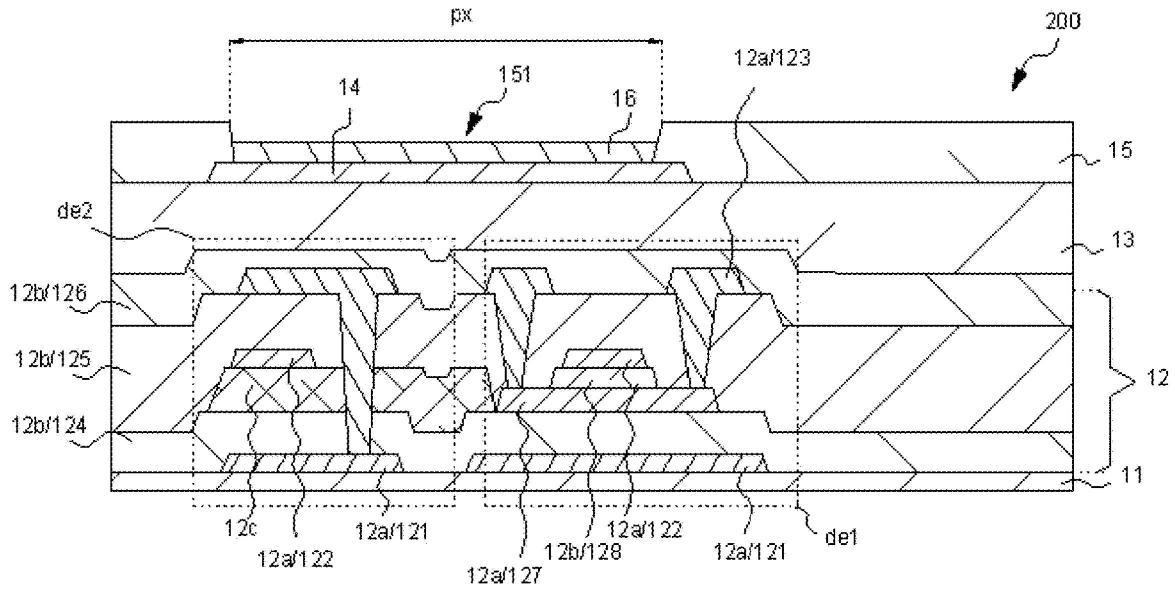
FIG. 7 is a schematic cross-sectional structural view of a display panel provided by the second embodiment of the present application.

Referring to FIGS. 6 and 7, the differences between the display panel 200 in the second embodiment and the display panel 100 in the first embodiment are that the conductive layers 12$a$ include a first conductive layer 121, a second conductive layer 122, a third conductive layer 123 and a fourth conductive layer 127, and the insulating layers 12$b$ include a first insulating layer 124, a second insulating layer 125, a third insulating layer 126 and a fourth insulating layer 128.

The first stacking structure de1 forms a thin-film transistor structure sequentially stacked by a portion of the first conductive layer 121, the first insulating layer 124, a portion of the fourth conductive layer 127, the fourth insulating layer 128, a portion of the second conductive layer 122, and the second insulating layer 125, a portion of the third conductive layer 123, and the third insulating layer 126.

The second stacking structure de2 forms a capacitor structure sequentially stacked by a portion of the first conductive layer 121, the first insulating layer 124, the compensation layer 12$c$, a portion of the second conductive layer 122, the second insulating layer 125, a portion of the third conductive layer 123, and the third insulating layer 126.

Material of the fourth conductive layer may be a semiconductor material.

Namely, the difference between the display panel 200 in the second embodiment and the display panel 100 in the first embodiment is that the first stacking structure de1 is differ from the second stacking structure de2.

Optionally, the compensation layer 12$c$ extends to a boundary of the first stacking structure de1 to compensate a height of an area between the first stacking structure de1 and the second stacking structure de2.

It should be noted that the display panel 200 in the second embodiment is illustrated with the first cross-sectional structure of the display panel 100 in the first embodiment as a comparison, but is not limited to it. For example, it can also be compared with the second, third or fourth cross-section structure.

Optionally, the display panel 200 of the second embodiment may be a top light emission type, namely, the electrode layer 14 has reflective property.

Figure 8:
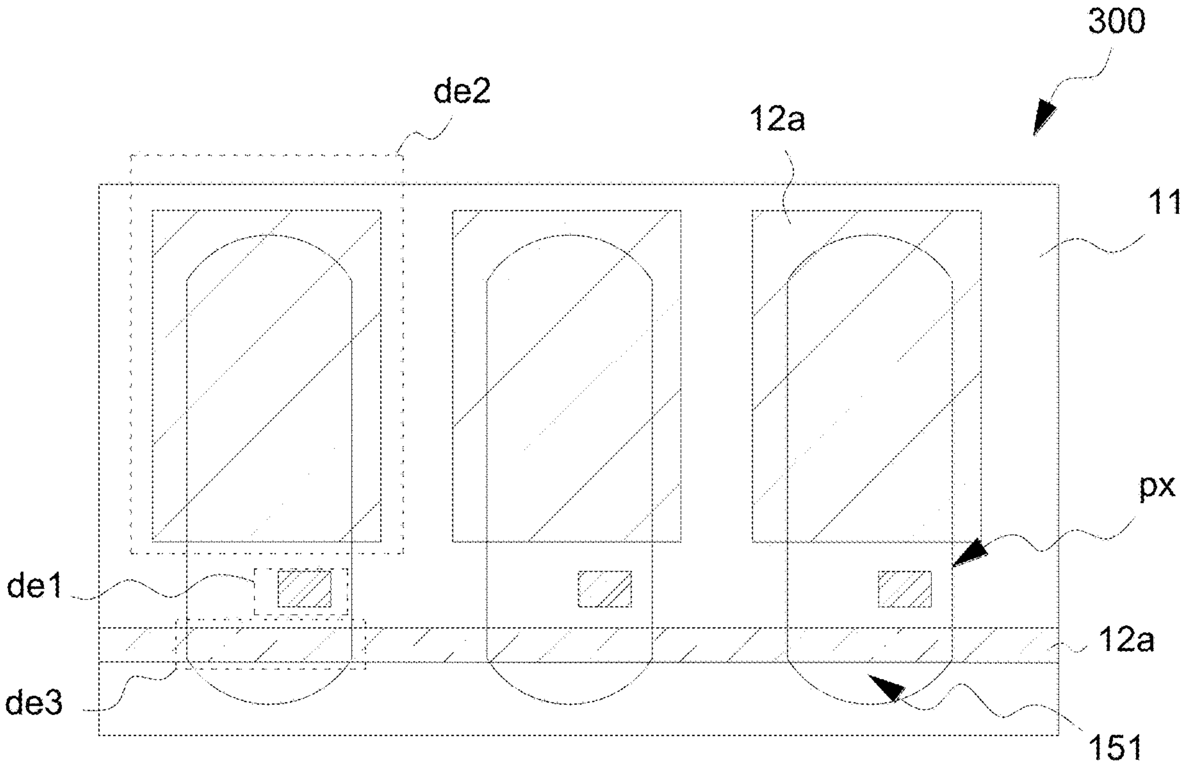
FIG. 8 is a schematic top structural view of a display panel provided by a third embodiment of the present application.
Figure 9:
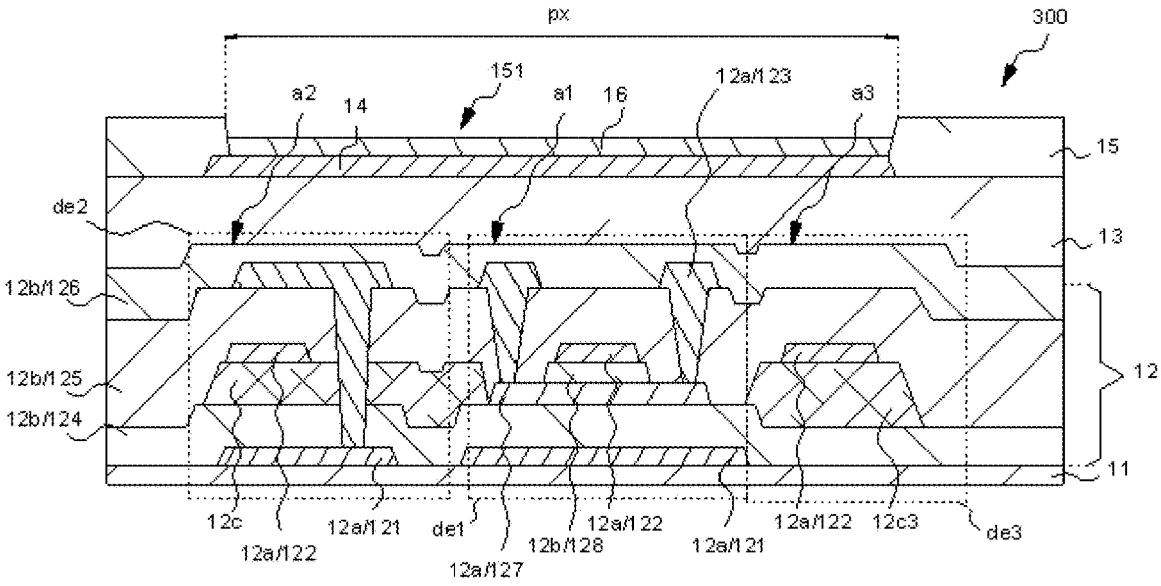
FIG. 9 is a schematic cross-sectional structural view of the display panel provided by the third embodiment of the present application.

Referring to FIGS. 8 and 9, the differences between the display panel 300 in the third embodiment and the display panel 200 in the second embodiment are that:

the thin-film transistor layer 12 further includes a third stacking structure de3 provided corresponding to the opening 151. In an area of a same opening 151, the third stacking structure de3 is located at one side of the second stacking structure de2. The third stacking structure de3 includes a third compensation layer 12$c$2 and at least one conductive layer 12$a$. A number of the conductive layers 12$a$ of the first stacking structure de1 is greater than a number of the conductive layers 12$a$ of the third stacking structure de3.

In a stacking direction of the third stacking structure de3, the third compensation layer 12$c$3 is provided at any position on the substrate.

The display panel 300 in the third embodiment uses the compensation layer 12$c$ to increase a height of the second stacking structure de2, and use the third compensation layer 12$c$3 to increase a height of the third stacking structure de3, so as to compensate for a height difference between the two and the first stacking structure de1, so as to facilitate to form a flat or a relatively flat planarization layer 13 in the subsequent formation process.

Optionally, the third compensation layer can also be defined as a padded layer to increase the height of the third stacking structure de3.

Optionally, the compensation layer 12$c$ and the third compensation layer 12$c$3 may be provided at same layer. Such arrangement compensates for a height difference between the second stacking structure de2 and the third stacking structure de3 and reduces process steps.

Optionally, a thickness of the third compensation layer 12$c$3 is greater than a thickness of the compensation layer 12$c$. Such arrangement compensates for a height difference between the second stacking structure de2 and the third stacking structure de3.

Optionally, a thickness of the third compensation layer 12$c$3 is greater than or equal to a sum of a thickness of the fourth insulating layer 128 and a thickness of the fourth conductive layer 127.

Optionally, a surface a1 of the first stacking structure de1 away from the substrate 11, a surface a2 of the second stacking structure de2 away from the substrate 11, and a surface a3 of the third stacking structure de3 away from the substrate 11 are flush. Such arrangement facilitates the planarization layer 13 forming a flat surface.

Optionally, the first stacking structure de1 is a thin-film transistor structure, the second stacking structure de2 is a capacitor structure, and the third stacking structure de3 is a single routing stacking structure.

Optionally, on the basis of display panel 400 in the second embodiment, the third stacking structure de3 is formed by stacking the first insulating layer 124, the third compensation layer 12$c$3, a portion of the second conductive layer 122, the second insulating layer 125, and the third insulating layer 126.

Figure 10:
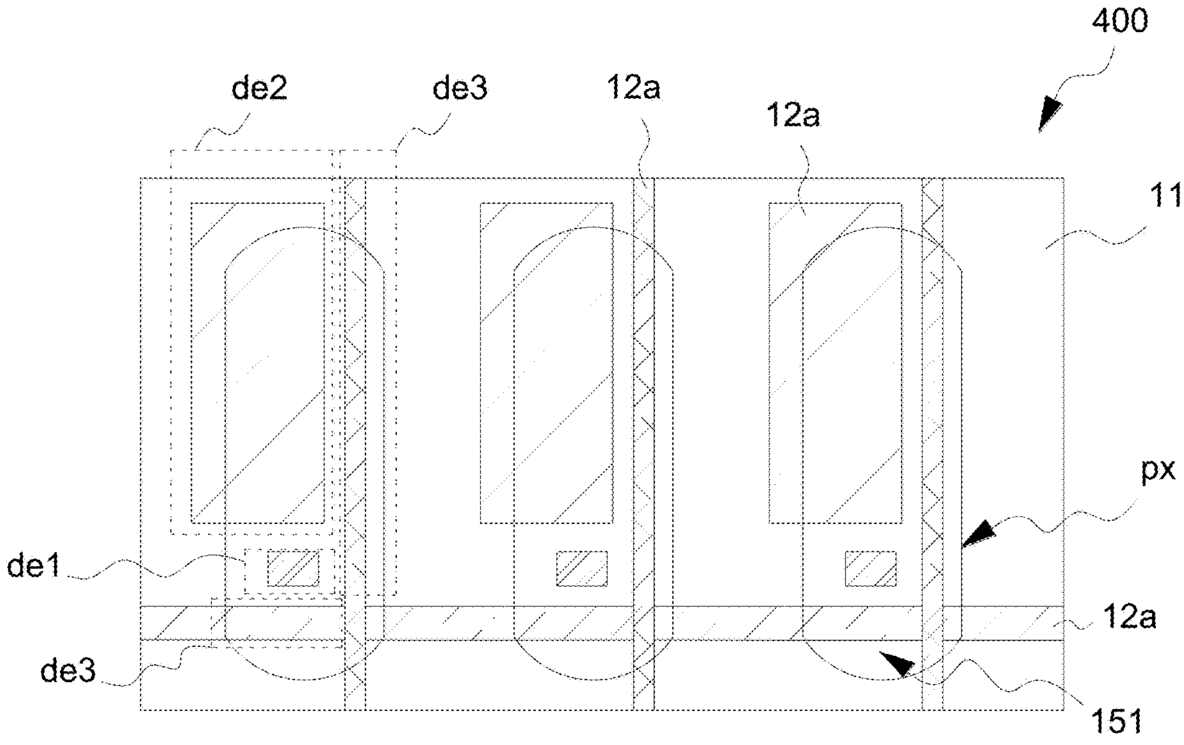
FIG. 10 is a schematic top structural view of a display panel provided by a fourth embodiment of the present application.

Referring to FIG. 10, the difference between the display panel 400 in the fourth embodiment and the display panel 300 in the third embodiment is that: the thin-film transistor layer 12 includes at least two third stacking structures de3 on the basis of the display panel 300 in the third embodiment. The display panel 400 in the fourth embodiment takes two third stacking structures de3 as examples, but is not limited thereto.

The conductive layers 12$a$ in the two third stacking structures de3 are provided in different layers. For example, the conductive layer 12$a$ of one of the two third stacking structures de3 is the second conductive layer 122, and the conductive layer 12$a$ of the other of the two third stacking structures de3 is the third conductive layer 123.

The structures of the first stacking structure de1 and the second stacking structure de2 in the fourth embodiment are same or similar to the structures of the first stacking structure de1 and the second stacking structure de2 in the third embodiment.

Embodiments of the present application of a display panel include a substrate, a thin-film transistor layer, a planarization layer, an electrode layer, a pixel definition layer and light-emitting layer arranged in sequence. A thin-film transistor layer includes a first stacking structure and a second stacking structure. Both of the first stacking structure and the second stacking structure are provided corresponding to a same pixel region. The first stacking structure includes conductive layers arranged in different layers. The second stacking structure includes a compensation layer and at least one insulating layer. A number of the conductive layers of the first stacking structure is greater than a number of the conductive layers of the second stacking structure. The compensation layer is used to increase a height of the second stacking structure. The planarization layer covers the thin-film transistor layer, and a surface of the planarization layer away from the substrate is a flat surface. The display panel of this embodiment adds a compensation layer in the second stacking structure to reduce the height difference between the first stacking structure and the second stacking structure, so that the planarization layer can flatten the first stacking structure and the second stacking structure, so as to provide a flat reference plane for the formation of the light-emitting layer, and then reduce the risk of uneven film thickness of the light-emitting layer.

The above description describes a display panel provided by the embodiments of the present application in detail. In this context, specific examples are used to explain the principle and implementation means of the present application. The description of the above embodiments is only used to help understand the methods and core ideas of the present application. Moreover, for those skilled in the art, they may change in the specific implementation means and application scope according to the ideas of the present application. In summary, the content of this specification should not be construed as a limitation to the present application.

What is claimed is:

1. A display panel comprising a plurality of pixel regions, wherein the display panel comprises:

a substrate;

a thin-film transistor layer provided on the substrate, and comprising a first stacking structure and a second stacking structure, wherein the first stacking structure comprises a plurality of conductive layers arranged in different layers, and a plurality of insulating layers, the second stacking structure comprises a compensation layer and the insulating layers, wherein a number of the conductive layers of the first stacking structure is greater than a number of conductive layers of the second stacking structure; and a height of the first stacking structure is greater than or equal to a height of the second stacking structure, and the compensation layer is used to increase the height of the second stacking structure;

a planarization layer covering the thin-film transistor layer;

an electrode layer provided on the planarization layer;

a pixel definition layer provided on the electrode layer, and comprising a plurality of openings, one of the openings is corresponding to one of the pixel regions, and the first stacking structure and the second stacking structure provided corresponding to a same opening; and a light-emitting layer provided in the opening;

wherein the second stacking structure further comprises at least one of the conductive layers;

wherein the second stacking structure comprises a first compensation structure and a second compensation structure, wherein the first compensation structure comprises a first compensation layer and the insulating layers; the second compensation structure comprises a second compensation layer and the insulating layers, a number of the conductive layers of the second compensation structure is less than a number of the conductive layers of the first compensation structure;

the first compensation layer is provided at any position on the substrate in a stacking direction of the first compensation structure; and the second compensation layer is provided at any position on the substrate in a stacking direction of the second compensation structure.

2. The display panel according to claim 1, wherein a side of the first stack structure away from the substrate is flush with a side of the second stack structure away from the substrate.

3. The display panel according to claim 1, wherein a portion of a surface of the planarization layer away from the substrate corresponding to the pixel regions is a planar surface.

4. The display panel according to claim 1, wherein the compensation layer is provided at any position on the substrate in a stacking direction of the second stacking structure.

5. The display panel according to claim 4, wherein the compensation layer has multiple layers, and the multiple layers of the compensation layer are arranged in different layers from each other in the stacking direction of the second stacking structure.

6. The display panel according to claim 1, wherein the first compensation layer is connected to the second compensation layer.

7. The display panel according to claim 1, wherein a thickness of the first compensation layer is less than a thickness of the second compensation layer.

8. The display panel according to claim 1, wherein the thin-film transistor layer further comprises a third stacking structure provided corresponding to the opening, wherein the third stacking structure is located at a side of the second stacking structure in an area of the same opening, and the third stacking structure comprises a third compensation layer and at least one of the conductive layers, and the number of the conductive layers of the first stacking structure is greater than a number of the conductive layers of the third stacking structure; and wherein the third compensation layer is provided at any position on the substrate in a stacking direction of the third stacking structure.

9. The display panel according to claim 8, wherein a surface of the first stacking structure away from the substrate, a surface of the second stacking structure away from the substrate, and a surface of the third stacking structure away from the substrate are flush.

10. The display panel according to claim 4, wherein the conductive layers comprise a first conductive layer, a second conductive layer, and a third conductive layer, and the insulating layers comprise a first insulating layer, a second insulating layer, and a third insulating layer;

the first stacking structure forms a capacitor structure sequentially stacked by a portion of the first conductive layer, the first insulating layer, a portion of the second conductive layer, the second insulating layer, a portion of the third conductive layer, and the third insulating layer; and the second stacking structure is sequentially stacked by the compensation layer, the first insulating layer, a portion of the second conductive layer, the second insulating layer, and the third insulating layer.

11. The display panel according to claim 10, wherein a thickness of the compensation layer is less than a sum of a thickness of the first conductive layer and a thickness of the third conductive layer.

12. The display panel according to claim 4, wherein the conductive layers comprise a first conductive layer, a second conductive layer, a third conductive layer, and a fourth conductive layer, and the insulating layers comprise a first insulating layer, a second insulating layer, a third insulating layer, and a fourth insulating layer; and the first stacking structure forms a thin-film transistor structure sequentially stacked by a portion of the first conductive layer, the first insulating layer, a portion of the fourth conductive layer, the fourth insulating layer, a portion of the second conductive layer, and the second insulating layer, a portion of the third conductive layer, and the third insulating layer; and the second stacking structure forms a capacitor structure sequentially stacked by the portion of the first conductive layer, the first insulating layer, and the compensation layer, the portion of the second conductive layer, the second insulating layer, the portion of the third conductive layer, and the third insulating layer.

13. The display panel according to claim 8, wherein the conductive layers comprise a first conductive layer, a second conductive layer, a third conductive layer, and a fourth conductive layer, and the insulating layers comprise a first insulating layer, a second insulating layer, a third insulating layer, and a fourth insulating layer; and the first stacking structure forms a thin-film transistor structure sequentially stacked by a portion of the first conductive layer, the first insulating layer, a portion of the fourth conductive layer, the fourth insulating layer, a portion of the second conductive layer, and the second insulating layer, a portion of the third conductive layer, and the third insulating layer; and the second stacking structure forms a capacitor structure sequentially stacked by the portion of the first conductive layer, the first insulating layer, and the compensation layer, the portion of the second conductive layer, the second insulating layer, the portion of the third conductive layer, and the third insulating layer; the third stacking structure is formed by sequentially stacking of the first insulating layer, the third compensation layer, a portion of the second conductive layer, the second insulating layer, and the third insulating layer.

14. The display panel according to claim 13, wherein a thickness of the third compensation layer is greater than or equal to a sum of a thickness of the fourth insulating layer and a thickness of the fourth conductive layer.

15. A display panel comprising a plurality of pixel regions, wherein the display panel comprises:

a substrate;

a thin-film transistor layer provided on the substrate, and comprising a first stacking structure and a second stacking structure, wherein the first stacking structure comprises a plurality of conductive layers arranged in different layers, and a plurality of insulating layers, the second stacking structure comprises a compensation layer and the insulating layers, wherein a number of the conductive layers of the first stacking structure is greater than a number of conductive layers of the second stacking structure; and a height of the first stacking structure is greater than or equal to a height of the second stacking structure, and the compensation layer is used to increase the height of the second stacking structure;

a planarization layer covering the thin-film transistor layer;

an electrode layer provided on the planarization layer;

a pixel definition layer provided on the electrode layer, and comprising a plurality of openings, one of the openings is corresponding to one of the pixel regions, and the first stacking structure and the second stacking structure provided corresponding to a same opening; and a light-emitting layer provided in the opening;

wherein the second stacking structure further comprises at least one of the conductive layers;

wherein the second stacking structure comprises a first compensation structure and a second compensation structure, wherein the first compensation structure comprises a first compensation layer and the insulating layers; the second compensation structure comprises a second compensation layer and the insulating layers, a number of the conductive layers of the second compensation structure is less than a number of the conductive layers of the first compensation structure.

16. The display panel according to claim 15, wherein the compensation layer is provided at any position on the substrate in a stacking direction of the second stacking structure.

17. The display panel according to claim 16, wherein the compensation layer has multiple layers, and the multiple layers of the compensation layer are arranged in different layers from each other in the stacking direction of the second stacking structure.

* * * * *